US005490182A

United States Patent [19]
Arai

[11] Patent Number: 5,490,182
[45] Date of Patent: Feb. 6, 1996

[54] PHASE-LOCKED LOOP CIRCUIT HAVING RING OSCILLATOR

[75] Inventor: Masanobu Arai, Tokyo, Japan

[73] Assignee: NEC Corporation, Tokyo, Japan

[21] Appl. No.: 248,254

[22] Filed: May 24, 1994

[30] Foreign Application Priority Data

May 25, 1993 [JP] Japan ..................................... 5-122897

[51] Int. Cl.$^6$ ..................................................... H03D 3/24
[52] U.S. Cl. .............................. 375/376; 331/34; 331/57; 331/187; 327/159
[58] Field of Search ............................ 375/376; 331/1 R, 331/1 A, 34, 57, 187; 327/156, 158, 159

[56] References Cited

U.S. PATENT DOCUMENTS

| 5,331,294 | 7/1994 | Watanabe et al. ......................... 331/57 |
| 5,349,311 | 9/1994 | Mentzer ..................................... 331/57 |

FOREIGN PATENT DOCUMENTS 62-13025   1/1987   Japan .

Primary Examiner—Stephen Chin
Assistant Examiner—Don N. Vo
Attorney, Agent, or Firm—Foley & Lardner

[57] ABSTRACT

A phase-locked loop circuit has a ring oscillator comprising a plurality of 1st, 2nd, . . . , nth inverter chains composed of series-connected 21, 22, . . . , 2n inverters (n≧2), respectively, an (n+1)th inverter chain composed of an odd number of series-connected inverters, and a plurality of 1st–nth selectors associated with the 1st–nth inverter chains, respectively, for selectively outputting input signals to and output signals from the 1st–nth inverter chains, the 1st–nth inverter chains being combined respectively with the 1st–nth selectors in respective combinations, the combinations and the (n+1)th inverter chain being connected in a ring configuration. A phase comparator compares an input clock signal and an oscillated clock signal from the ring oscillator in phase, and applies an output signal to a control circuit which controls the 1st–nth selectors to synchronize the oscillated clock signal with the input clock signal.

9 Claims, 3 Drawing Sheets

PHASE-LOCKED LOOP CIRCUIT HAVING RING OSCILLATOR

BACKGROUND OF THE INVENTION

1. Field of the Invention

The present invention relates to a phase-locked loop circuit, and more particularly to a phase-locked loop circuit implemented as a digital circuit.

2. Description of the Prior Art

Phase-locked loop (PLL) circuits have heretofore been based on the analog circuit technology. In a widespread PLL design, an oscillated clock signal is fed back to a phase comparator, and an analog oscillating circuit is controlled based on the result of comparison between the clock signal which is fed back and an input clock signal.

According to a recent attempt to realize a digital PLL, an oscillating circuit comprises a ring oscillator composed of an odd number of series-connected inverters as disclosed, for example, in Japanese Utility Model Laid-Open No. 13025/87. However, the disclosed oscillating circuit is not of the fully digital type because an NMOS threshold voltage is controlled in an analog manner to control the delay times of the inverters for controlling the oscillation frequency.

In recent years, CMOS digital LSI circuits have been finding wide industrial use. Great advantages can be achieved if a circuit such as a PLL, which has heretofore been implemented as an analog circuit, can be realized by a CMOS digital LSI circuit.

One solution for realizing a PLL with a CMOS digital LSI circuit is to use a ring oscillator. However, since the delay times of inverters which determine the oscillation frequency of the ring oscillator vary from LSI sample to LSI sample by a magnitude ranging from about ½ to 2 times, it is necessary to introduce some digital arrangement for synchronizing the oscillation frequency of the ring oscillator with the frequency of the input signal. The delay times of inverters on one LSI chip vary somewhat from each other.

SUMMARY OF THE INVENTION

It is therefore an object of the present invention to provide a phase-locked loop circuit which is constructed as a CMOS digital circuit.

Another object of the present invention is to provide a phase-locked loop circuit which suffers reduced jitter.

To achieve the above objects, there is provided in accordance with the present invention a phase-locked loop circuit comprising ring oscillator means comprising 1st, 2nd, . . . , nth inverter chains composed of series-connected $2^1$, $2^2$, $2^n$ inverters ($n \geq 2$), respectively, an (n+1)th inverter chain composed of an odd number of series-connected inverters, and 1st–nth selectors associated with the 1st–nth inverter chains, respectively, for selectively outputting input signals to and output signals from the 1st–nth inverter chains, the 1st–nth inverter chains being combined respectively with the 1st–nth selectors in respective combinations, the combinations and the (n+1)th inverter chain being connected in a ring configuration, phase comparator means for comparing an input clock signal and an oscillated clock signal from the ring oscillator in phase, and control circuit means responsive to an output signal from the phase comparator for controlling the 1st–nth selectors to synchronize the oscillated clock signal with the input clock signal.

The 1st–nth selectors are operated to selectively take the 1st–nth inverter chains into and out of the ring oscillator. Those inverter chains which are incorporated in the ring oscillator, the selectors, and the (n+1) inverter chain make up the ring oscillator for varying the oscillation frequency thereof. The oscillation frequency of the ring oscillator is controlled by the control circuit to produce an output clock signal in synchronism with the input clock signal. The phase-locked loop circuit according to the present invention can be implemented by a CMOS digital circuit.

If the selector corresponding to any one of the 1st–nth inverter chains were operated while a changing signal in the ring oscillator is passing through that inverter chain, it would become impossible to properly control the oscillation frequency of the ring oscillator. Therefore, the selector is operated while the changing signal is passing through the (n+1)th inverter chain.

The control circuit comprises an up/down counter for counting up or down pulses of the oscillated clock signal depending on the output signal from the phase comparator, and controlling the 1st–nth selectors with control bits thereof successively in ascending order. If the oscillated clock signal is lagging behind (or leading) the input clock signal, then the up/down counter counts down (or up) pulses of the oscillated clock signal to reduce (or increase) the number of inverters incorporated in the ring oscillator to thereby increase (or reduce) the oscillation frequency of the ring oscillator to advance (or retard) the phase of the oscillated clock signal.

The phase comparator comprises a D flip-flop having a data input terminal for inputting the input clock signal and a clock input terminal for inputting the oscillated clock signal.

The ring oscillator further comprises an (n+2)th inverter chain having two series-connected inverters, and an (n+1)th selector for selectively outputting an input signal to and an output signal from the (n+2)th inverter chain, wherein the control circuit comprises means for controlling the (n+1)th selector with a signal that is m bits lower than the bit of the up/down counter to cause the first selector to incorporate the (n+2)th inverter chain in the ring oscillator once while a changing signal cycles about $2^m$ times through the ring oscillator. With this arrangement, while a changing signal cycles about $2^m$ times through the ring oscillator, the number of inverters in the ring oscillator can be adjusted in apparent steps of less than two inverters, thereby reducing jitter.

The (n+1)th selector is controlled by the output signal from the phase comparator. The control of the ring oscillator is stabilized by employing both a control process based on the up/down counter and a control process based on the output signal from the phase comparator.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

Figure 1:
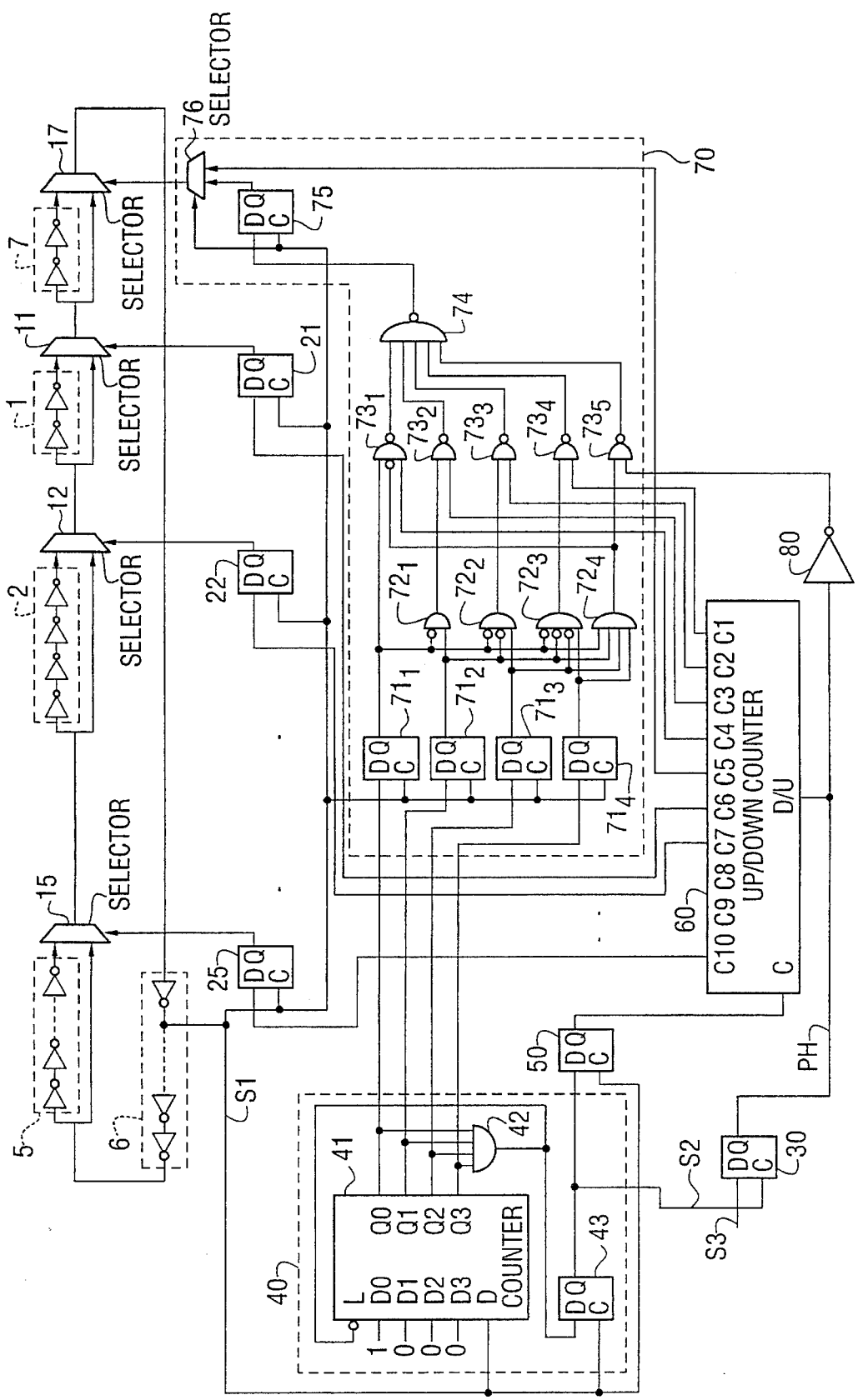
FIG. 1 is a block diagram of a phase-locked loop circuit according to the present invention.

As shown in FIG. 1, a phase-locked loop circuit according to the present invention comprises a first inverter chain 1, a second inverter chain 2, a third inverter chain (not shown), a fourth inverter chain (not shown), a fifth inverter chain 5, a sixth inverter chain 6, a seventh inverter chain 7, a first selector 11, a second selector 12, a third selector (not shown), a fourth selector (not shown), a fifth selector 15, a seventh selector 17, a plurality of D flip-flops 21, 22, ..., 25, 30, 50, a frequency divider 40, an up/down counter 60, an inverter 80, and a decimal point control/stabilization control circuit 70.

The first inverter chain 1 comprises $2^1=2$ inverters which are connected in series with each other. The second inverter chain 2 comprises $2^2=4$ inverters which are connected in series with each other. The third and fourth inverter chains comprise $2^3=8$ inverters and $2^4=16$ inverters, respectively, which are connected in series with each other. The fifth inverter chain 5 comprises $2^5=32$ inverters which are connected in series with each other. The sixth inverter chain 6 comprises an odd number of (nine in the illustrated embodiment) inverters which are connected in series with each other. The seventh inverter chain 7 comprises two inverters which are connected in series with each other.

The first selector 11 serves to selectively output an input signal applied to the first inverter chain 1 and an output signal supplied from the first inverter chain 1. The second selector 12 serves to selectively output an input signal applied to the second inverter chain 2 and an output signal supplied from the second inverter chain 2. The third selector serves to selectively output an input signal applied to the third inverter chain and an output signal supplied from the third inverter chain. The fourth selector serves to selectively output an input signal applied to the fourth inverter chain and an output signal supplied from the fourth inverter chain. The fifth selector 15 serves to selectively output an input signal applied to the fifth inverter chain 5 and an output signal supplied from the fifth inverter chain 5. The seventh selector 17 serves to selectively output an input signal applied to the seventh inverter chain 7 and an output signal supplied from the seventh inverter chain 7. The combination of the first inverter chain 1 and the first selector 11, the combination of the second inverter chain 2 and the second selector 12, the combination of the third inverter chain and the third selector, the combination of the fourth inverter chain and the fourth selector, the combination of the fifth inverter chain 5 and the fifth selector 15, the inverter chain 6, and the combination of the seventh inverter chain 7 and the seventh selector 17 are connected in a ring configuration as a ring oscillator. By controlling the selectors 11–15, 17, it is possible to change the number of inverters that can be incorporated in the ring oscillator by 2 from 9 to 11 to ... to 73 for thereby changing the frequency of an oscillated clock signal S1 of the ring oscillator through 32 steps.

The frequency divider 40 divides by 15 the oscillation frequency (which may be of 30.72 MHz for example) of the oscillated clock signal S1 outputted from the ring oscillator, specifically from the first inverter of the sixth inverter chain 6, producing an oscillated clock signal S2 having a frequency of 2.045 MHz. The frequency divider 40 comprises a counter 41 for counting pulses of the oscillated clock signal S1, an AND gate 42 for producing an output signal of "1" when all of output signals Q0–Q3 (Q3 is the MSB [Most Significant Bit]) from the counter 41 become "1", i.e., when the count of the counter 41 becomes 15, and a D flip-flop 43 for latching the output signal of the AND gate 42 in response to a positive-going edge of the oscillated clock signal S1.

The D flip-flop 30, which functions as a phase comparator, has a clock input terminal for inputting the oscillated clock signal S2 from the D flip-flop 43 and a data input terminal for inputting an input clock signal S3 having a frequency of 2.048 MHz. When the D flip-flop 30 is supplied with the oscillated clock signal S2, if the data input signal is "1" and the D flip-flop 30 produces a Q output signal of "1," then the oscillated clock signal S1 (S2) can be determined as lagging behind the input clock signal S3, and if the data input signal is "0" and the D flip-flop 30 produces a Q output signal of "0," then the oscillated clock signal S1 (S2) can be determined as leading the input clock signal S3.

The up/down counter 60, which is of 10 bits and serves as a control circuit, has a clock input terminal C that is supplied with the oscillated clock signal S2 outputted from the frequency divider 40, an up/down switching input terminal D/U that is supplied with an output signal PH from the phase comparator 30, and output terminals (control bits) C10, C9, C8, C7, C6 (C10 is MSB) connected respectively to the D flip-flops 25, ..., 22, 21 which control the selectors 15, ..., 12, 11. When the oscillated clock signal S2 lags behind (or leads) the input clock signal S3, the up/down counter 60 counts down (or up) pulses of the oscillated clock signal S2 to reduce (or increase) the number of inverters incorporated in the ring oscillator for thereby increasing (or reducing) the oscillation frequency of the ring oscillator to advance (or retard) the phase of the oscillated clock signal S2.

The selectors 11, 12, ..., 15 select output signals from the inverter chains 1, 2, ..., 5, respectively, if the output signals from the D flip-flops 21, 22, ..., 25 are "1", thereby incorporating the inverter chains 1, 2, ..., 5 into the ring oscillator. Since the inverter chains 5–1 each having as many inverters as a power of 2 are controlled from the bits C10–C6 of the up/down counter 60, the oscillation frequency can be changed successively through 32 steps at a minimum interval corresponding to 2 steps.

One possible problem to be solved when the PLL is implemented with only a digital LSI circuit is any variation of the inverter delay time from LSI sample to LSI sample. If the delay time of one inverter is 0.5 ns and the delay time of one selector is 0.5 ns, then the time required for a signal to go through a shortest cyclic loop of the ring oscillator is 0.5 ns×15=7.5 ns as the shortest cyclic loop is composed of the selectors 11, 12, ..., 15, 17, and the inverter chain 6, and the time required for a signal to go through a longest cyclic loop of the ring oscillator is 39.5 ns because the longest cyclic loop is composed of selectors 11, 12, ..., 15, 17, the inverter chain 6, and the inverter chains 1–5, 7. Therefore, the ratio of the longest cyclic loop to the shortest cyclic loop is 5. Stated otherwise, in order to oscillate the ring oscillator at 30.72 MHz, one cyclic loop of the ring oscillator has a delay time of about 16 ns. Even if one inverter or selector step has a delay time which may vary from 0.21 ns to 1.23 ns, the PLL circuit according to the present invention can accommodate delay time variations. Therefore, the PLL circuit according to the present invention can be implemented by a CMOS digital LSI circuit.

Another possible problem to be solved is concerned with the timing of switching from a number of inverters to another number of inverters. If the fifth selector 15, for example, is operated while a changing signal which goes through the ring oscillator is passing through the fifth inverter chain 5, the oscillation frequency of the ring oscillator cannot be controlled properly. Thus, it is necessary to operate selectors 11–15, 17 while a changing signal is not within inverter chains 1–5, 7. The sixth inverter chain 6 serves to allow selectors 11–15, 17 to operate while a changing signal is passing through inverter chains 1–5, 7. Specifically, when a changing signal enters the sixth inverter chain 6, the values of control bits C6–C10 of the up/down counter 60 are read into the respective D flip-flops 21–25 to thereby operate selectors 11–15. If the delay times of the D flip-flops 21–25 are shorter than the delay time of the sixth inverter chain 6, selectors 11–15 are operated while a changing signal is passing through inverter chains 1–5, 7.

Still another problem to be solved involves a means for reducing jitter produced by the PLL circuit. As described above, the time required for a changing signal to go through one cyclic loop of the ring oscillator can be controlled only in steps which each correspond to two elemental inverters. If the delay time of one inverter is 0.5 ns, then since jitter which is 1 ns in one cyclic loop cycles 30 times in a period of 488 ns for making comparison with the input clock signal S3 of 2.048 MHz, there is generated jitter by signal cycling in 30 ns. In order to reduce the jitter, it is necessary to control the number of inverters in the ring oscillator as if handling a decimal point (decimal point control process). The decimal point control/stabilization control circuit 70 serves as a circuit for controlling the number of inverters as if handling a decimal point. The decimal point control/stabilization control circuit 70 functions to produce apparent steps each corresponding to two or fewer elemental inverters by controlling whether the seventh inverter chain 7 is to be incorporated in the ring oscillator and how many times, out of 30 times, the seventh inverter chain 7 is to be incorporated in the ring oscillator in each of 30 cyclic loops each of 16 ns contained in the period of 488 ns at 2,048 MHz. More specifically, control bit C5 of the up/down counter 60 is connected to the decimal point control/stabilization control circuit 70 for incorporating the seventh inverter chain 7 in the ring oscillator only while the oscillated clock signal S1 of 30.48 MHz is "1," and becomes the MSB for the decimal point control. The control bit C4 of the up/down counter 60 controls the seventh inverter chain 7 to be incorporated in the ring oscillator seven times, in seven out of fifteen cyclic loops while the oscillated clock signal S1 of 30.48 MHz is "0." To minimize the jitter, it is preferable to distribute the seven cyclic loops as uniformly as possible in the fifteen cyclic loops. As indicated in Table 1 below, when control bit C4 is C4=1, the seventh inverter chain 7 is incorporated in the ring oscillator every other time in fifteen times, i.e., seven out of fifteen times. In Table 1, the seventh inverter chain 7 is incorporated in the ring oscillator in each of the periods indicated by the mark "O". Similarly, control bits C3, C2, C1 are also connected to control the seventh inverter chain 7 to be incorporated in the ring oscillator in the periods indicated in Table 1. Since the seventh inverter chain 7 is incorporated in the ring oscillator seven times when control bit C4 is C4=1, four times when control bit C3 is C3=1, two times when control bit C2 is C2= 1, and once when control bit C1 is C1=1, control bits C5 through C1 are arranged to incorporate the seventh inverter chain 7 in the ring oscillator substantially depending on their weights while the changing signal cycles about 32 times (which is the 5th power of 2). In the final cyclic loop of the 30 cyclic loops, the seventh inverter chain 7 is controlled in a stabilization control process (to be described hereinafter) by the output signal PH from the phase comparator 30 irrespective of control bits C5–C1. As described above, the seventh inverter chain 7 and the seventh selector 17 are used to carry out both the decimal point control and stabilization control processes. In Table 1, the mark "*" represents "Don't care."

TABLE 1

| Control bit | | | | Phase | Period in which the inverter chain 7 is incorporated in the ring oscillator | | | | | | | | | | | | | | | The number of times the inverter chain 7 is |
|---|---|---|---|---|---|---|---|---|---|---|---|---|---|---|---|---|---|---|---|---|
| C4 | C3 | C2 | C1 | PH | 1 | 2 | 3 | 4 | 5 | 6 | 7 | 8 | 9 | 10 | 11 | 12 | 13 | 14 | 15 | incorporated. |
| 0 | 0 | 0 | 0 | * | X | X | X | X | X | X | X | X | X | X | X | X | X | X | * | 0 |
| 0 | 0 | 0 | 1 | 8 | X | X | X | X | X | X | X | O | X | X | X | X | X | X | * | 1 |
| 0 | 0 | 1 | 0 | * | X | X | X | O | X | X | X | X | X | X | O | X | X | X | * | 2 |
| 0 | 0 | 1 | 1 | * | X | X | X | O | X | X | X | O | X | X | X | O | X | X | * | 3 |
| 0 | 1 | 0 | 0 | * | X | O | X | X | X | O | X | X | X | O | X | X | X | O | * | 4 |
| 0 | 1 | 0 | 1 | * | X | O | X | X | X | O | X | O | X | O | X | X | X | O | * | 5 |
| 0 | 1 | 1 | 0 | * | X | O | X | O | X | O | X | X | X | O | X | O | X | O | * | 6 |
| 0 | 1 | 1 | 1 | * | X | O | X | O | X | O | X | O | X | O | X | O | X | O | * | 7 |
| 1 | 0 | 0 | 0 | * | O | X | O | X | O | X | O | X | O | X | O | X | O | X | * | 7 |
| 1 | 0 | 0 | 1 | * | O | X | O | X | O | X | O | O | O | X | O | X | O | X | * | 8 |
| 1 | 0 | 1 | 0 | * | O | X | O | O | O | X | O | X | O | O | O | X | O | X | * | 9 |
| 1 | 0 | 1 | 1 | * | O | X | O | O | O | X | O | O | O | O | O | X | O | X | * | 10 |
| 1 | 1 | 0 | 0 | * | O | O | O | X | O | O | O | X | O | O | O | X | O | O | * | 11 |
| 1 | 1 | 0 | 1 | * | O | O | O | X | O | O | O | O | O | O | O | X | O | O | * | 12 |
| 1 | 1 | 1 | 0 | * | O | O | O | O | O | O | O | X | O | O | O | O | O | O | * | 13 |
| 1 | 1 | 1 | 1 | * | O | O | O | O | O | O | O | O | O | O | O | O | O | O | * | 14 |
| * | * | * | * | Lead | * | * | * | * | * | * | * | * | * | * | * | * | * | * | O | — |
| * | * | * | * | Lag | * | * | * | * | * | * | * | * | * | * | * | * | * | * | X | — |

The decimal point control/stabilization control circuit 70 comprises D flip-flops 71₁–71₄, AND gates 72₁–72₄, NAND gates 73₁–73₅, 74, a D flip-flop 75, and a selector 76. Each of the D flip-flops 71₁–71₄ latches the output signals Q0–Q3 of the counter 41 of the frequency divider 40. The AND gate 72₁ ANDs the inversion of the Q output signal of the D flip-flop 71₁ and the Q output signal of the D flip-flop 71₂, and outputs "1" when the count of the counter 41 is 2, 6, 10, or 14. The AND gate $72_2$ ANDs the inversions of the Q output signals of the D flip-flops $71_1$, $71_2$ and the Q output signal of the D flip-flop $71_3$, and outputs "1" when the count of the counter 41 is 4 or 12. The AND gate $72_3$ ANDs the inversions of the Q output signals of the D flip-flops $71_1$, $71_2$, $71_3$ and the Q output signal of the D flip-flop $71_4$, and outputs "1" when the count of the counter 41 is 8. The AND gate $72_4$ ANDs the Q output signals of the D flip-flops $71_1$, $71_2$, $71_3$, $71_4$, and outputs "1" when the count of the counter 41 is 15. The NAND gate $73_1$ NANDs the Q output signal of the D flip-flop $71_1$, the inversion of the output signal of the AND gate $72_4$, and the output signal from control bit C4, and outputs "0" when control bit C4 is "1" and the count of the counter 41 is 1, 3, 5, 7, 9, 11, or 13. The NAND gate $73_2$ NANDs the output signal of the AND gate $72_1$ and the output signal from control bit C3, and outputs "0" when control bit C3 is "1" and the count of the counter 41 is 2, 6, or 10. The NAND gate $73_3$ NANDs the output signal of the AND gate $72_2$ and the output signal from control bit C2, and outputs "0" when control bit C2 is "1" and the count of the counter 41 is 4 or 12. The NAND gate $73_4$ NANDs the output signal of the AND gate $72_3$ and the output signal from control bit C1, and outputs "0" when the count of the counter 41 is 8. The NAND gate $73_5$ NANDs the output signal of the AND gate $72_4$ and the inversion of an output signal from an inverter 80, which represents the inversion of the output signal PH from the phase comparator 30, and outputs "0" when the count of the counter 41 is 15 and the oscillated clock signal S1 lags behind the input clock signal S3. The NAND gate 74 NANDs the output signals from the NAND gates $73_1$–$73_5$ and outputs "1" when the output signal of either one of the NAND gates $73_1$–$73_5$ is "0." The D flip-flop 75 latches the output signal of the NAND gate 74. The selector 76 selects the output signal from control bit C5 when the oscillated clock signal S1 of 30.48 MHz, for example, is "1," and the output signal from the D flip-flop 75 when the oscillated clock signal S1 of 30.48 MHz, for example, is "0," for controlling the seventh selector 17. When supplied with the output signal of "1" from selector 76, the seventh selector 17 selects the output signal from the seventh inverter chain 7, i.e., incorporates the seventh inverter chain 7 in the ring oscillator.

The stabilization control process will next be described. If only the above control process is carried out, the ring oscillator suffers a second order lag due to the integration by the up/down counter 60 and the integration for converting the oscillation frequency of the ring oscillator into phase, resulting in unstable control operation. One solution is to add a control path which is free of the integration by the up/down counter 60. Specifically, when the oscillated clock signal S1 is leading the input clock signal S3, the decimal point control/stabilization control circuit 70 establishes a control path from the phase comparator 30 to inverter 80 to NAND gate $73_5$ to NAND gate 74 which bypasses the up/down counter 60 for increasing the number of times that the seventh inverter chain 7 is incorporated in the ring oscillator.

Figure 2:
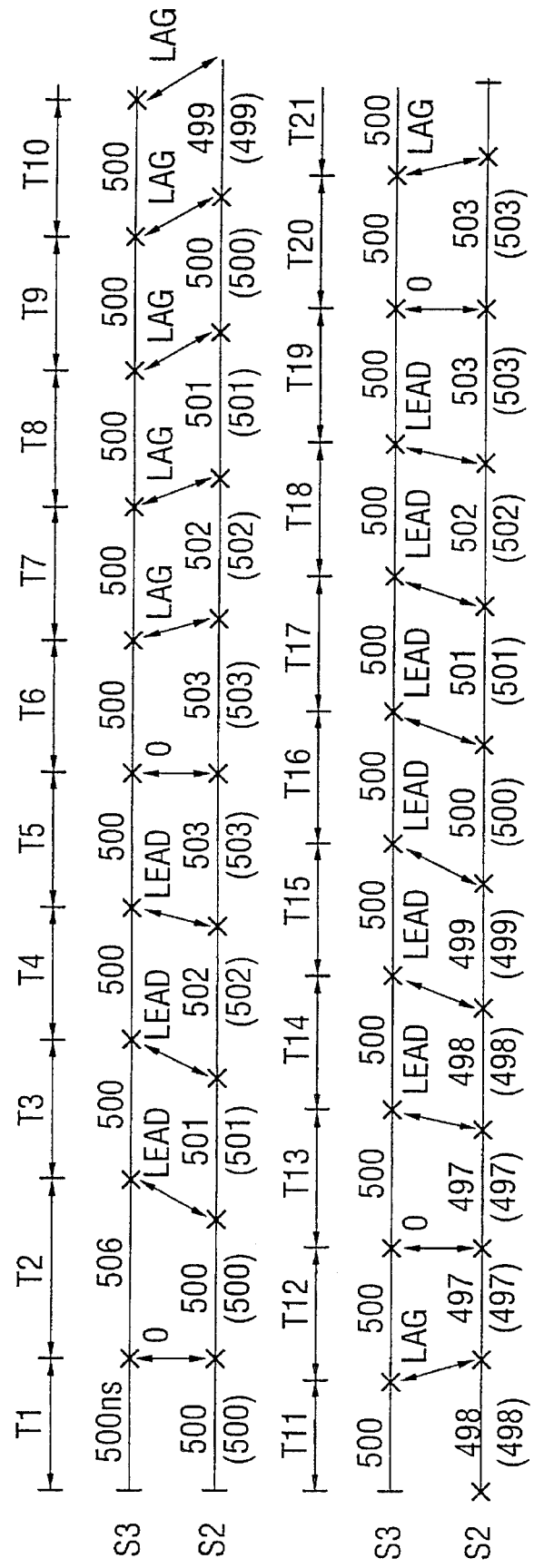
FIG. 2 is a diagram showing the leading and lagging of an oscillated clock signal and the counts (upper values) and periods (lower values) of an up/down counter after an input clock signal undergoes a phase jump of 6 ns when the number of inverters in a ring oscillator is controlled by only the up/down counter.

FIG. 2 shows the leading and lagging of the oscillated clock signal S2 and the counts (upper values) and periods (lower values) of the up/down counter 60 after the input clock signal S3 undergoes a phase jump of 6 ns when the number of inverters in the ring oscillator is controlled by only the up/down counter 60. For illustrative purposes, the period of the input clock signal S3 is approximated to 500 ns although it is actually 488 ns.

When a phase jump of 6 ns occurs in the input clock signal S3 in a period $T_2$, since the oscillated clock signal S2 leads the input clock signal S3, the count of the up/down counter 60 is incremented by 1. When the count of the up/down counter 60 becomes 503 in a period $T_5$ (the period is also 503 ns), the oscillated clock signal S2 is brought into phase with the input clock signal S3. Since, however, the oscillated clock signal S2 lags behind the input clock signal S3 in a next period $T_6$, the count of the up/down counter 60 is decremented by 1. The oscillated clock signal S2 is brought into phase with the input clock signal S3 when the count of the up/down counter 60 becomes 497 in a period $T_{12}$. In a next period $T_{13}$, however, the oscillated clock signal S2 leads the input clock signal S3 again, and the count of the up/down counter 60 is incremented by 1. When the count of the up/down counter 60 becomes 503 in a period $T_{19}$, the oscillated clock signal S2 is brought into phase with the input clock signal S3. Subsequently, the oscillated clock signal S2 repeatedly lags behind, is brought into phase with, and leads the input clock signal S3. Therefore, the oscillated clock signal S2 oscillates in phase with respect to the input clock signal S3 and does not converge.

Figure 3:
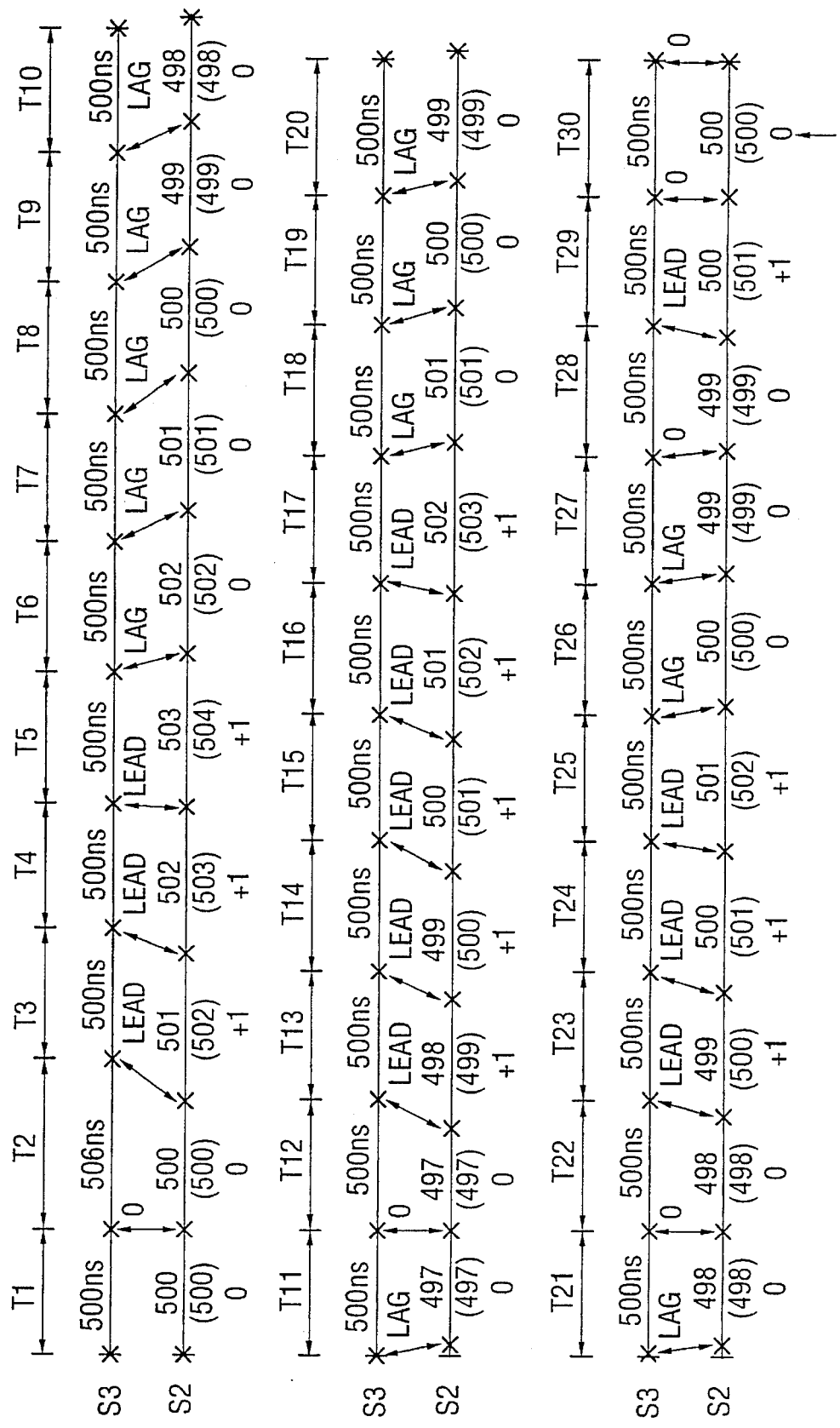
FIG. 3 is a diagram showing the leading and lagging of the oscillated clock signal, the counts (upper values) and periods (middle values) of the up/down counter, and stabilization control values (lower values) after the input clock signal undergoes a phase jump of 6 ns when the number of inverters in the ring oscillator is controlled by both the up/down counter and a stabilization control process.

FIG. 3 shows the leading and lagging of the oscillated clock signal S2, the counts (upper values) and periods (middle values) of the up/down counter 60, and stabilization control values (lower values) after the input clock signal S3 undergoes a phase jump of 6 ns when the number of inverters in the ring oscillator is controlled by both the up/down counter 60 and the above stabilization control process.

When a phase jump of 6 ns occurs in the input clock signal S3 in a period $T_2$, since the oscillated clock signal S2 leads the input clock signal S3, the count of the up/down counter 60 is incremented by 1 in a next period $T_3$, and the period is incremented by 1 into 502 ns by the stabilization control process. Inasmuch as the oscillated clock signal S2 is still leading the input clock signal S3, the count of the up/down counter 60 is further incremented by 1 in a next period $T_4$, and the period is incremented by 1 into 503 ns by the stabilization control process. Since the oscillated clock signal S2 is still leading the input clock signal S3, the count of the up/down counter 60 is increased to 503 and the period to 504 ns in a next period $T_5$ by the up/down counter 60 and the stabilization control process. However, the oscillated clock signal S2 now lags behind the input clock signal S3. Thereafter, the count of the up/down counter 60 is decremented by 1, and the stabilization control process is not effected. In a period $T_{11}$, the oscillated clock signal S2 is in phase with the input clock signal S3. In a next phase $T_{12}$, however, the oscillated clock signal S2 leads the input clock signal S3 again, and the count of the up/down counter 60 is incremented by 1 in a phase $T_{13}$. Subsequently, when the oscillated clock signal S2 leads the input clock signal S3, the stabilization control process is carried out, and when the oscillated clock signal S2 lags behind the input clock signal S3, the stabilization control process is not carried out. When the count of the up/down counter 60 becomes 500 and the period of the oscillated clock signal S2 becomes 501 ns in a period $T_{29}$, the oscillated clock signal S2 is brought into phase with the input clock signal S3. In a next period $T_{30}$, the count of the up/down counter 60 becomes 500 and the period of the oscillated clock signal S2 becomes 500 ns, with the result that the oscillated clock signal S2 converges in phase with respect to the input clock signal S3.

Although a certain preferred embodiment of the present invention has been shown and described in detail, it should be understood that various changes and modifications may be made therein without departing from the scope of the appended claims.

What is claimed is:

1. A phase-locked loop circuit comprising:

ring oscillator means comprising a plurality of 1st, 2nd, ..., nth inverter chains composed of series-connected $2^m, 2^2, \ldots, 2^n$ inverters ($n \geq 2$), respectively, an (n+1)th inverter chain composed of an odd number of series-connected inverters, and a plurality of 1st–nth selectors associated with said 1st–nth inverter chains, respectively, for selectively outputting either input signals or output signals of respective said 1st–nth inverter chains, said 1st–nth inverter chains being combined respectively with said 1st–nth selectors and with said (n+1)th inverter chain in a ring configuration which outputs an oscillated clock signal;

phase comparator means for comparing an input clock signal and the oscillated clock signal; and control circuit means responsive to an output signal from said phase comparator means for controlling said 1st–nth selectors to synchronize said oscillated clock signal with said input clock signal.

2. A phase-locked loop circuit according to claim 1, wherein said control circuit means comprises means for controlling said 1st–nth selectors while a changing signal cycling through said ring oscillator means is passing through said (n+1)th inverter chain.

3. A phase-locked loop circuit according to claim 1, wherein said control circuit means comprises an up/down counter for counting up or down pulses of said oscillated clock signal depending on the output signal from said phase comparator means, and controlling said 1st–nth selectors with control bits thereof successively in ascending order.

4. A phase-locked loop circuit according to claim 1, wherein said phase comparator means comprises a D flip-flop having a data input terminal for inputting said input clock signal and a clock input terminal for inputting said oscillated clock signal.

5. A phase-locked loop circuit according to claim 3, wherein said ring oscillator means further comprises an (n+2)th inverter chain having two series-connected inverters, and an (n+1)th selector for selectively outputting either an input signal or an output signal of said (n+2)th inverter chain, and wherein said control circuit comprises means for controlling said (n+1)th selector with a signal that represents a value that is m bits lower than a value represented by a bit of said up/down counter for controlling said first selector such that the output signal of said (n+2)th inverter chain is selected by the (n+1)th selector once while a changing signal is cycling $2^m$ times through said ring oscillator means.

6. A phase-locked loop circuit according to claim 5, wherein said control circuit means comprises means for controlling said (n+1)th selector with the output signal from said phase comparator means.

7. A phase-locked loop circuit according to claim 1, wherein said phase comparator means comprises means for comparing the input clock signal and a chain oscillated clock signal at the input of said (n+1)th inverter chain.

8. A phase-locked loop circuit according to claim 1, wherein said (n+1)th inverter chain is connected between said 1st inverter chain and said nth inverter chain.

9. A phase-locked loop circuit according to claim 8, wherein the oscillated clock signal is output from a first of said odd number of series connected inverters of said (n+1)th inverter chain.

* * * * *